(12) United States Patent
Lisi et al.

(10) Patent No.: US 6,956,787 B2
(45) Date of Patent: Oct. 18, 2005

(54) METHOD AND DEVICE FOR TIMING RANDOM READING OF A MEMORY DEVICE

(75) Inventors: Carlo Lisi, Milan (IT); Marco Ferrario, Milan (IT); Massimiliano Scotti, Cernusco sul Naviglio (IT); Emanuele Confalonieri, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/700,322

(22) Filed: Nov. 3, 2003

(65) Prior Publication Data

US 2004/0151035 A1 Aug. 5, 2004

(30) Foreign Application Priority Data

Nov. 6, 2002 (EP) .............................. 02425676

(51) Int. Cl.[7] ................................ G11C 8/00
(52) U.S. Cl. ...................... 365/233; 365/191; 365/196; 365/189.11
(58) Field of Search ................. 365/233, 191, 365/195, 196, 189.11

(56) References Cited

U.S. PATENT DOCUMENTS

| | | | |
|---|---|---|---|
| 4,558,435 A | * 12/1985 | Hsieh ......................... 365/203 |
| 5,436,869 A | * 7/1995 | Yoshida ................. 365/230.02 |
| 5,740,115 A | 4/1998 | Ishibashi et al. |
| 5,930,197 A | 7/1999 | Ishibashi et al. |
| 5,970,022 A | * 10/1999 | Hoang ..................... 365/233.5 |
| 6,104,653 A | 8/2000 | Proebsting |
| 6,163,475 A | 12/2000 | Proebsting |
| 6,198,682 B1 | 3/2001 | Proebsting |
| 6,208,575 B1 | 3/2001 | Proebsting |
| 6,212,109 B1 | 4/2001 | Proebsting |
| 6,240,046 B1 | 5/2001 | Proebsting |
| 6,266,264 B1 | 7/2001 | Proebsting |
| 6,278,638 B1 | 8/2001 | Tomita et al. |
| 6,282,135 B1 | 8/2001 | Proebsting |
| 6,353,350 B1 | 3/2002 | Bedarida et al. |
| 6,356,485 B1 | 3/2002 | Proebsting |
| 6,373,753 B1 | 4/2002 | Proebsting |
| 6,462,584 B1 | 10/2002 | Proebsting |
| 6,462,998 B1 | 10/2002 | Proebsting |
| 6,842,391 B2 | * 1/2005 | Fujioka et al. .............. 365/219 |

* cited by examiner

Primary Examiner—Tan T. Nguyen
(74) Attorney, Agent, or Firm—Lisa K. Jorgenson; James H. Morris; Wolf, Greenfield & Sacks, P.C.

(57) ABSTRACT

A device for timing random reading of a memory device with a data access time, in which reading is performed by a succession of consecutive operations, the timing device being designed to generate, for each operation, a corresponding timing signal such as to cause, whatever the operating condition of the memory device, the corresponding operation to last for a time equal to a respective fixed duration, which is determined so as to guarantee completion of the operation in the worst operating condition of the memory device within the fixed duration; the sum of the fixed durations being equal to the data access time of the memory device.

17 Claims, 4 Drawing Sheets

A - ADDRESS TRANSITION TO READING OPERATION START
B - SENSING
C - DATA LATCHING TO OUTPUT TRANSITION

METHOD AND DEVICE FOR TIMING RANDOM READING OF A MEMORY DEVICE

BACKGROUND OF THE INVENTION

1. Field of the Invention

The present invention relates to a method and a device for timing random reading of a memory device.

2. Discussion of the Related Art

As is known, random reading of the data stored in a memory device involves execution of a succession of operations, each of which starts at the instant in which the previous one terminates.

The operations making up reading have a duration that varies according to the operating temperature and the supply voltage of the memory device, and, in particular, the duration of each operation decreases as the supply voltage increases and as the operating temperature of the memory device decreases.

The most widespread method for reading data stored in a memory device basically envisages comparison of a quantity correlated to the current flowing in the memory cell in which the datum to be read is stored with a similar quantity correlated to the current flowing in a reference memory cell, in which a known datum is stored.

In particular, to carry out reading of a memory cell, the gate terminal of the memory cell is supplied with a read voltage comprised between the threshold voltage of an erased memory cell and the threshold voltage of a written memory cell, in such a way that, if the memory cell is written, the read voltage is lower than its threshold voltage and, therefore, no current flows in the memory cell, whereas, if the memory cell is erased, the read voltage is greater than its threshold voltage and, consequently, there is current flowing in the memory cell.

Reading of a memory cell is carried out, as has been said above, by means of a reading circuit of the type described, for example, in the European patent application EP-A-0814480 filed on Jun. 18, 1996, in the name of the present applicant, the circuit diagram of which is represented, for reasons of convenience, in FIG. 1 and which is incorporated herein by reference.

According to what is illustrated in FIG. 1, the read circuit, designated as a whole by 1, basically includes an array branch 2 connected, via an array bitline 3, to an array memory cell 4, the contents of which is to be read; a reference branch 5 connected, via a reference bitline 6, to a reference memory cell 7, the contents of which is known; a current/voltage converter stage 8 basically made up of a current mirror connected to the array and reference branches 2, 5 for converting the currents flowing in the array memory cell 4 and in the reference memory cell 7 in respective electrical potentials; and a comparator stage 9 basically made up of a differential amplifier designed to compare said electrical potentials with one another in order to output a logic output signal OUT indicating the binary information "0" or "1" stored in the array memory cell 4.

Reading of a datum from the memory device typically entails simultaneous reading of a very high number of memory cells, and, consequently, during reading of a datum, there is normally a high current absorption from the supply, which generates sharp and sudden drops in the supply voltage that constitute in effect a noise superimposed on the nominal supply voltage.

Said sharp variations in the supply voltage, commonly referred to as "ripple", adversely affect proper operation of the differential amplifier of the comparator stage 9, in so far as they cause instability of the output signal OUT generated by the latter and, consequently, indeterminacy and unreliability of the binary information read from the array memory cell 4.

The supply noise rejection of the read circuit, i.e., its insensitivity to the supply noise, deteriorates as the supply voltage increases but, above all, as the read time decreases, so that an improvement of the supply noise rejection could be obtained only at the expense of a significant increase in the time during which sensing of the stored datum is carried out by the differential amplifier of the comparator stage 9 and, consequently, at the expense of a significant increase in access time.

For this reason, in the memory devices in which each of the operations making up reading starts at the instant in which the previous operation terminates, it is not possible to reduce significantly the supply noise rejection of the read circuit.

Apart from this drawback, the memory devices in which each of the operations making up reading starts at the instant in which the previous operation terminates suffer from a further drawback linked to the data access time, which represents one of the most important parameters in evaluating the competitiveness of a memory device.

As is known, in fact, the data access time of a memory device can be defined as the time interval which elapses, in the worst operating conditions of the memory device, between the instant in time in which there occurs a variation of the addresses on the inputs of the memory device due to a request for reading a new datum and the instant in time in which the required datum is stably present on the outputs of the memory device and can therefore be read.

By way of example, FIG. 2 is a schematic illustration of the three parts which can be considered as making up the data access time. In particular, the access time is made up of: a first part, designated by the letter A, the time duration of which is equal to the time elapsing between the instant in time in which there occurs the variation of the addresses on the inputs of the memory device due to request for reading a new datum and the instant in time in which the read operations effectively start; a second part, designated by the letter B, the duration of which is equal to the time necessary for the read circuit to carry out reading proper of the datum from the memory cell, i.e., to carry out the so-called "sensing" of the datum; and a third part, designated by the letter C, the duration of which is equal to the time elapsing between the instant in time in which the read circuit supplies the datum read and the instant in time in which the datum read is stably available on the outputs of the memory device and can thus be read.

Since the data access time is defined in the worst conditions of operation of the memory device in terms of operating temperature and supply voltage, when the memory device operates in more favourable conditions, the datum required is supplied on the outputs of the memory device in a time that is shorter than the access time from when variation of the addresses has occurred.

In many applications, however, said advance is frequently cancelled out by the fact that the end user of the memory device carries out reading of the data only after a time interval has elapsed equal to the access time from when variation of the addresses on the inputs of the memory device has occurred.

SUMMARY OF THE INVENTION

An object of the present invention is to provide a method and a device for timing random reading of a memory device which will enable a considerable improvement in supply noise rejection as compared to known memory devices without, however, this entailing any deterioration of the data access time.

According to the present invention, a method for timing random reading of a memory device is provided, with a data access time, said reading being made up of a succession of consecutive operations, said method being characterized in that each of said operations has, whatever the operating condition of said memory device, a fixed predetermined duration such as to guarantee completion of the operation within said fixed predetermined duration in the worst operating condition of said memory device, the sum of the fixed predetermined durations of said operations being equal to said data access time of said memory device.

According to the present invention, a device for random reading of a memory device is moreover provided, with a data access time, said reading being made up of a succession of consecutive operations, said timing device being characterized in that it comprises signal generating means, designed to generate, for each said operation, a corresponding timing signal such as to cause, whatever the operating condition of said memory device, the corresponding operation to last for a fixed predetermined duration such as to guarantee completion of said operation in the worst operating condition of said memory device, the sum of the durations of said operations being equal to said data access time of said memory device.

BRIEF DESCRIPTION OF THE DRAWINGS

The present invention will now be described, with reference to the attached drawings, which illustrate a non-limiting example of embodiment and in which.

DETAILED DESCRIPTION

Figure 1:
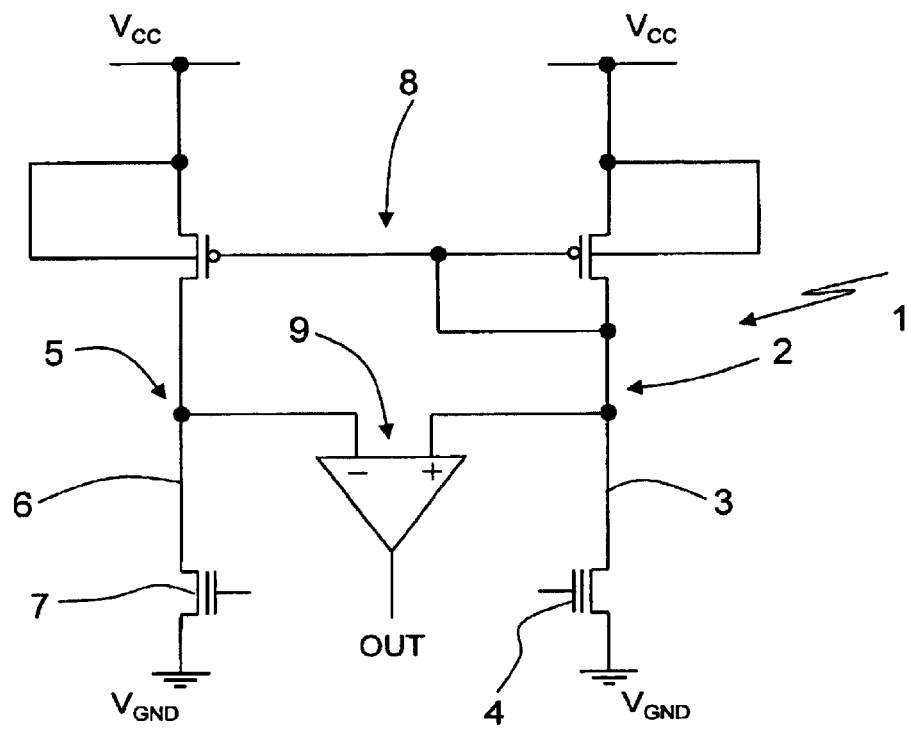
FIG. 1 shows a read circuit of a memory device according to the prior art.
Figure 2:
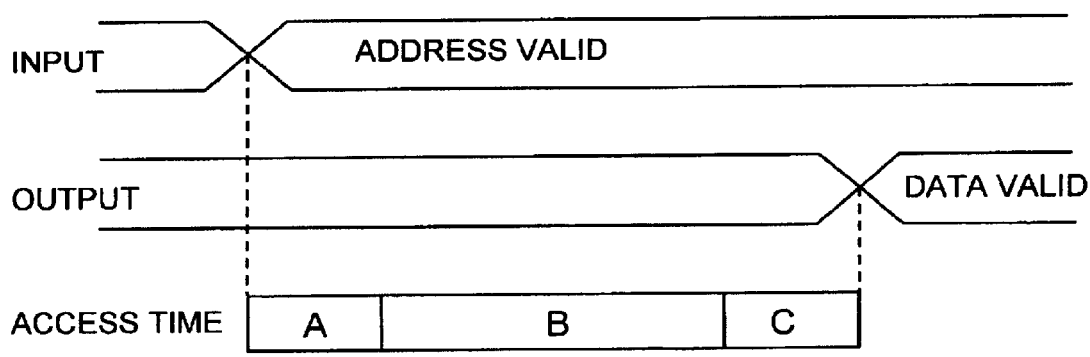
FIG. 2 is a schematic illustration of a timing sequence of the parts making up the data access time of a memory device.

The source of the present invention is precisely the fact that supply noise rejection of the read circuit of a memory device can be considerably improved by increasing the time dedicated to sensing of the stored datum and the fact that, when the memory device operates in more favourable operating conditions than the ones for which the data access time is defined, the datum required is supplied on the outputs of the memory device before a time elapses equal to the data access time from when a variation of the addresses has occurred.

In particular, the present invention is based upon the principle of improving the supply rejection noise of the read circuit using precisely the time "over", which is available when the memory device is operating in more favourable operating conditions than the ones for which the data access time is defined, i.e., the time elapsing between the instant in which the datum required is supplied on the outputs of the memory device and the instant in which the data access time terminates, in order to increase the time dedicated to sensing of the stored datum.

The above principle is implemented by distributing the entire data access time between the various operations making up reading, in such a way that each operation will have a fixed predetermined time duration such as to guarantee completion of the operation itself in the worst operating conditions of the memory device, and then causing each operation to last for a time equal to the fixed predetermined duration assigned thereto whatever the operating condition of the memory device, i.e., irrespective of the operating temperature and of the supply voltage of the memory device. In other words, each operation is kept operative for a fixed preset time in any operating condition of the memory device, i.e., irrespective of the operating temperature and of the supply voltage of the memory device.

Consequently, when the memory device is operating in more favourable operating conditions than the ones for which the data access time is defined, even if each operation requires for its completion a time shorter than the one assigned thereto a priori, the operation is not considered terminated, and hence the subsequent operation is not started until all the time assigned to the operation has elapsed.

In other words, when the memory device is operating in more favourable operating conditions than the ones for which the data access time is defined, each of the operations making up reading has a duration longer than the duration of known memory devices, in which each of the operations making up reading starts at the instant in which the preceding operation terminates.

By causing each of the operations making up reading to last longer it is possible to obtain a considerable increase of the supply noise rejection of the read circuit, and this is obtained given the same data access time, in so far as the sum of the fixed predetermined durations assigned to the operations making up reading is equal to the data access time of the memory device irrespective of the operating conditions of the latter.

Figure 3:
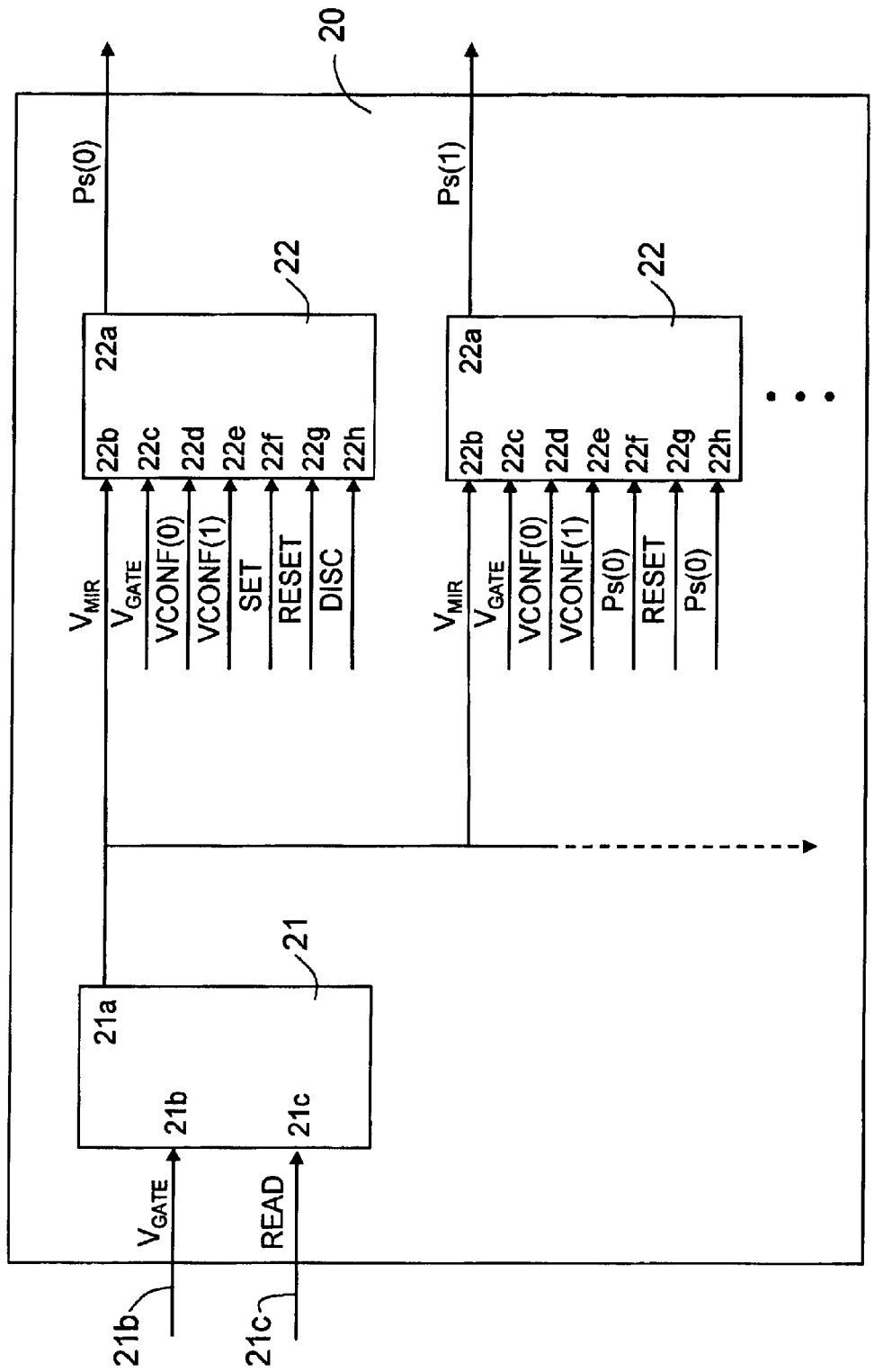
FIG. 3 illustrates a block diagram of a read timing device of a memory device according to the present invention.

The timing method according to the present invention can be implemented by a timing device of the type illustrated schematically in FIG. 3, in which only the parts useful for an understanding of the present invention are shown.

According to what is illustrated in FIG. 3, the timing device, designated as a whole by 20, comprises a voltage generating block 21 and a plurality of timing blocks 22, one for each of the operations making up reading, each of which is designed to generate a timing signal PS(i) (where i ranges from 1 to N, where N is the number of operations making up reading) such as to cause the corresponding operation to last, in any condition of operation of the memory device, for a fixed predetermined time, such as to guarantee completion of the operation itself in the worst operating condition of the memory device.

In particular, the timing signal PS(i) supplied by each timing block 22 has the function of keeping operative the corresponding operation making up reading of the memory device for a fixed duration, designated in what follows by $T_F(i)$, of a value equal to the fixed predetermined time.

The voltage generating block 21 has a first input 21b receiving a reference voltage $V_{GATE}$ that is constant and independent of the variations of the operating temperature and the supply voltage and is generated by a voltage generator (not illustrated) preferably, but not necessarily, of a band gap type; a second input 21c receiving a read signal READ; and an output 21a supplying a voltage $V_{MIR}$ that is constant and independent of the variations in the operating temperature and in the supply voltage.

Each timing block 22 comprises a plurality of inputs, in the case in point seven designated by 22b–22h, and an output 22a supplying a timing signal PS(i) for driving a respective operation making up reading, which is a pulse signal having a duration $T_{ON}$ (indicated in FIG. 5), which is fixed and constant and independent of the operating condition of the memory device, i.e., independent of the operating temperature and the supply voltage of the memory device. In particular, as will be explained in greater detail in what follows, the falling edge of each timing signal PS(i) drives termination of the respective operation and start of the next operation.

In particular, each timing block 22 has a first input 22b connected to the output 21a of the voltage generator 21, from which it receives the voltage $V_{MIR}$; a second input 22c set at the reference voltage $V_{GATE}$; a third input 22d and a fourth input 22e receiving respective time regulation signals VCONF(0) and VCONF(1) for controlling the duration $T_{ON}(i)$ of the timing signal PS(i) and hence the duration $T_F(i)$ of the corresponding read operation; a fifth input 22f receiving a signal varying from block to block according to the operation to which the timing block is associated; a sixth input 22g receiving a deactivation signal RESET; and a seventh input 22h receiving a signal varying from block to block according to the operation to which the timing block is associated.

In particular, the timing block 22 which generates the timing signal PS(0) for the first of the operations making up reading receives on the fifth input 22f an enable signal SET designed for enabling reading of the memory device and on the seventh input 22h a discharge command signal DISC, whilst each of the timing blocks 22 following the one that generates the timing signal PS(0) for the first of the operations making up reading receives both on the fifth input 22f and on the seventh input 22h the timing signal PS(i) generated by the timing block 22, which generates the timing signal PS(i) for the preceding operation.

Figure 4:
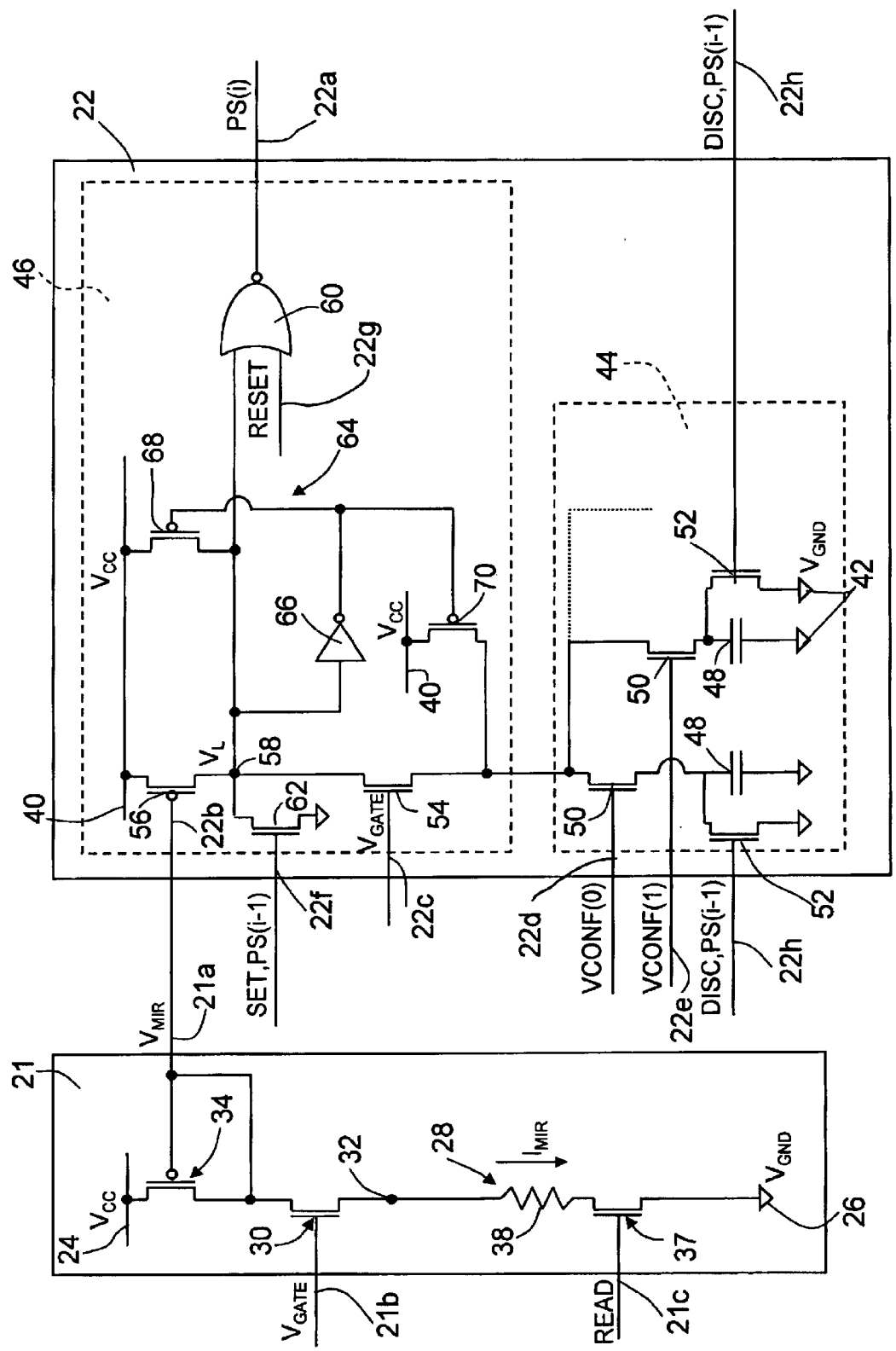
FIG. 4 illustrates the circuit diagram of some components of the timing device shown in FIG. 3.

The circuit structures of the voltage generating block 21 and of one of the timing blocks 22 are shown in greater detail in FIG. 4.

According to what is shown in FIG. 4, the voltage generating block 21, which, as has been said previously, has the function of generating a voltage $V_{MIR}$ that is constant and independent of the variations in operating temperature and supply voltage of the memory device, comprises a supply line 24 set at the supply voltage $V_{CC}$; a ground line 26 set at the ground voltage $V_{GND}$; a constant current generator stage 28; a decoupling stage 30 and a current-to-voltage converter stage 34 which are connected in series between the supply line 24 and the ground line 26.

In particular, the current-to-voltage converter stage 34 is made up of a natural PMOS transistor in a transdiode configuration, having a source terminal connected to the supply line 24 and gate and drain terminals both connected to the output 21a supplying the voltage $V_{MIR}$.

The decoupling stage 30 is made up of an NMOS transistor having a gate terminal connected to the first input 21b set at the constant reference voltage $V_{GATE}$, a drain terminal connected to the drain terminal of the PMOS transistor 34 and a source terminal defining an intermediate node 32.

In particular, the NMOS transistor 30 is sized in such a way as to have a preset length L1 and a preset width W1 (such as to determine draining of the current $I_{MIR}$) and is in a cascode configuration, in such a way as to guarantee a constant voltage between its own gate and source terminals, irrespective of the potential present on its own drain terminal. In this way, in fact, thanks to the constancy of the reference voltage $V_{GATE}$ on the gate terminal of the NMOS transistor 30, the potential present of the source terminal remains fixed, guaranteeing a constant voltage $V_S$ on the intermediate node 32, irrespective of the variations of the supply voltage $V_{CC}$. In other words, the function of the cascode NMOS transistor 30 is to decouple the intermediate node 32 from the supply line 24, thus guaranteeing constancy of the voltage $V_S$.

The constant current generator stage 28 comprises an NMOS transistor 37 and a resistor 38 connected in series between the intermediate node 32 and the ground line 26. In particular, the NMOS transistor 37 has a source terminal connected to the ground line 26, a gate terminal connected to the second input 21c supplying the read signal READ, and a drain terminal connected to a first terminal of the resistor 38, which has a second terminal connected to the intermediate node 32.

In particular, the resistor 38 is obtained using n-well technology, which, as is known, enables compensation of the variations in current $I_{MIR}$ produced by the variation in the threshold voltage $V_{TH}$ of the NMOS transistor 32 due to temperature variations. In the case in point, thanks to n-well technology, as the temperature varies, the resistance of the resistor 38 increases or decreases in such a way as to oppose the increase or decrease of the current $I_{MIR}$ caused by a corresponding variation in the threshold voltage $V_{TH}$ of the NMOS transistor 30 due to temperature variations.

The timing blocks 22 present identical circuit configurations and are all connected to the voltage generating block 21 so as to define, with the latter, N current mirrors. In the case in point, the current $I_{MIR}$ flowing through the constant current generator stage 28 of the voltage generating block 21 is mirrored and multiplied by a factor K in each of the N timing blocks 22.

From the above description, it should be pointed out that, by means of the aforesaid current mirror configuration, the current flowing through the N timing blocks 22 remains constant, whatever the operating condition of the memory device, i.e., also as the temperature or the supply voltage $V_{CC}$ varies.

With reference to the example appearing in FIG. 4, each timing block 22 comprises a supply line 40 set at the supply voltage $V_{CC}$; a ground line 42 set at the ground voltage $V_{GND}$; and a duration regulation stage 44 and a pulse generator stage 46, which are connected in series between the supply line 40 and the ground line 42.

The duration regulation stage 44 has the function of fixing the duration $T_{ON}(i)$ of the pulse signal PS(i) generated by the corresponding timing block 22 at a value equal to the fixed duration $T_F(i)$ assigned to the respective read operation.

The duration regulation stage 44 comprises a plurality of capacitors 48 connected in parallel to one another between the ground line 42 and the pulse generator stage 46; and a plurality of selection NMOS transistors 50, each of which is connected in series to a respective capacitor 48 for connecting/disconnecting selectively the capacitor from the rest of the duration regulation stage 44 in such a way as to cause increase/decrease of the overall load capacity $C_{LOAD}$ of the stage.

The example illustrated in FIG. 4 shows a duration regulation stage 44 comprising a pair of NMOS transistors 50 and a pair of capacitors 48, each connected between the ground line and a source terminal of a respective NMOS transistor 50. In particular, the NMOS transistors 50 have gate terminals connected to the third input 22d and the fourth input 22e of the timing block 22 and receive the first time regulation signal VCONF(0) and the second time regulation signal VCONF(1), and drain terminals connected to the pulse generator stage 46.

Regulation of the overall capacity $C_{LOAD}$ of the duration regulation stage 44 is obtained via the time regulation signals VCONF(0) and VCONF(1), which control, according to their logic state, turning-on and turning-off of the respective NMOS transistor 50, thus determining connection/disconnection of the corresponding capacitor 48 from the rest of the duration regulation stage 44.

Finally, the duration regulation stage 44 comprises a number of NMOS discharge transistors 52, each of which is connected in parallel to a respective capacitor 48 and performs the function of discharging, upon command, the respective capacitor 48 draining to ground the charge stored by the latter. In particular, each NMOS transistor 52 has a source terminal connected to the ground line 42, a gate terminal connected to the seventh input 22h, and a drain terminal connected to the intermediate node between the capacitor 48 and the corresponding NMOS transistor 50.

As already mentioned previously, the timing block 22, which generates the timing signal PS(i) for the first read operation, receives on the seventh input 22h the discharge signal DISC, whereas the subsequent timing blocks 22 receive on the seventh input 22h the pulse signal PS(i-1) generated by the preceding timing block 22.

The pulse generator stage 46 has the function of generating on the output 22a the pulse signal PS(i) with a time duration $T_{ON}(i)$ such as to drive a fixed predetermined duration $T_F(i)$ of a respective operation that makes up reading.

The pulse generator stage 46 comprises an NMOS transistor 54 and a PMOS transistor 56 connected in series between the duration regulation stage 44 and the supply line 40 and defining an intermediate node 58; and a logic gate 60 arranged between the intermediate node 58 and the output 22a of the timing block 22.

In particular, the PMOS transistor 56 is of a natural type and has a gate terminal connected to the first input 22b set at the voltage $V_{MIR}$, a source terminal connected to the supply line 40, and a drain terminal connected to the intermediate node 58, whilst the NMOS transistor 54 has a gate terminal connected to the second input 22c and receiving the reference voltage $V_{GATE}$, a drain terminal connected to the intermediate node 58, and a source terminal connected to the drain terminals of the transistors 50 of the duration regulation stage 44.

In the case in point, the NMOS transistor 54 is in a cascode configuration and is sized in such a way as to have a preset width W2=W1*K and a length L2=L1, so as to drain a current equal to the current generated by the current generator block 21 multiplied by a factor K, i.e., equal to $I_{MIR}$*K.

The NMOS transistor 54 is designed in such a way as to ensure a constant voltage on its own source terminal, irrespective of the variations of the supply voltage $V_{CC}$. Also in this case, in fact, in a way similar to the NMOS transistor 30 of the decoupling stage 30, the NMOS transistor 50 has the function of decoupling from one another its own drain and source terminals, maintaining the source potential "linked" to the potential of the gate terminal, which, being constant, guarantees a fixed value of potential on the source terminal, even with a variation in the supply voltage $V_{CC}$. Consequently, the voltage present on the node that connects the duration regulation stage 44 to the pulse generator stage 46 remains constant, irrespective of the variations in the supply voltage $V_{CC}$.

The logic gate 60 is of a NOR type and has a first input terminal connected to the intermediate node 58, a second input terminal connected to the sixth input 22g and receiving the deactivation signal RESET, and an output terminal connected to the output 22a of the timing block 22 and supplying the pulse signal PS(i). In particular, the deactivation signal RESET is generated by an OR logic gate (not illustrated), which receives on a first input a signal PWDOWN for controlling switching-off of the read circuits of the memory device, said signal having the function of preventing spurious readings of the memory device, and on a second input the negated read signal ⎕.

The pulse generator stage 46 further comprises an activation NMOS transistor 62 arranged between the intermediate node 58 and the ground line 42, and having the function of driving start of timing of the operation associated to the timing block 22. In detail, the NMOS transistor 62 has a source terminal connected to the ground line 42, a drain terminal connected to the intermediate node 58, and a gate terminal connected to the fifth input 22f of the timing block 22 and receiving the enabling signal SET or the timing signal PS(i) generated by the previous timing block 22, according to whether the timing block 22 is the first of the series or comes after the first one.

The pulse generator 46 finally comprises a pull-up stage 64 having the function of bringing the control voltage $V_L$ on the intermediate node 58 rapidly up to a preset high logic level so as to reduce the switching times of the logic gate 60 in the passage of the pulse signal PS(i) from the low logic level to the high logic level. In particular, the pull-up stage 64 comprises an inverter 66 having an input terminal connected to the intermediate node 58, and a pair of pull-up PMOS transistors 68-70, the first of which is arranged between the supply line 40 and the intermediate node 58, whilst the second one is connected between the supply line 40 and the source terminal of the NMOS transistor 54. The two PMOS transistors 68, 70 have gate terminals connected to the output terminal of the inverter 66, source terminals connected to the supply line 40, and drain terminals connected to the intermediate node 58 and to the source terminals of the NMOS transistor 54, respectively.

The time duration $T_{ON}(i)$ of each pulse signal PS(i) generated by the timing blocks 22 for controlling the duration of the operations that make up reading is fixed by regulating, via the regulation signals VCONF(0) and VCONF(1), the load capacity $C_{LOAD}(i)$ of the duration regulation stage 44. In the case in point, the time duration TON Of a pulse signal PS(i) is adjusted according to the following relation:

$$T_{ON}(i) = \frac{C_{LOAD}(i) * (V_{GATE} - V_{TH}) * K}{I_{MIR}}$$

where $C_{LOAD}(i)$ is the load capacity of the duration regulation stage 44 of the i-th timing block 22, $V_{GATE}$ is the constant reference voltage on the gate terminal of the NMOS transistor 50, and $V_{TH}$ is the threshold voltage of the NMOS transistor 54 of the i-th timing block 22.

In use, assignment of the fixed predetermined duration $T_{ON}$ to each time operation, and hence the duration of the pulse signals PS(i), may, for instance, be made in the design stage by appropriately encoding the duration regulation signals, so as to have in use a preset load capacity $C_{LOAD}$ for each timing block 22.

In non-read conditions, the timing device 20 remains in a wait state, and the N pulses PS(i) outputted by the N timing blocks 22 have a low logic level. In this condition, in fact, the read signal READ is at the low logic level, the RESET signal supplied by the OR logic gate (not illustrated) is hence at the high logic level and, consequently, the pulse signal PS(i) on the output of the NOR logic gate has a low logic level. Furthermore, in the aforesaid condition, the read signal READ, having a low logic level, maintains the NMOS transistor 37 off, thus preventing draining of the current $I_{MIR}$. Consequently, the currents (having the value $I_{MIR}*K$), which flow through the N duration regulation stages 44 of the N timing blocks 22 are zero.

The aforesaid condition terminates when, following upon a datum read request, the read signal READ and the enable signal SET switches from the low logic level to the high logic level, thus determining start of timing of the operations that make up reading.

In this step, the negated read signal ⬜ goes to a low logic level, and, since the signal PWDOWN is also at a low logic level, the RESET signal supplied by the OR logic gate (not illustrated) goes to a low logic level.

At this point, the timing signals PS(i) generated by the N timing blocks 22 switch simultaneously from the low logic level to the high logic level. In the case in point, in the first timing block 22, switching-on of the NMOS transistor 62, driven by the enable signal SET, determines discharge of the drain terminal of the NMOS transistor 50 and lowering of the control voltage $V_L$ in the intermediate node 58, which goes to a low logic level, determining switching of the pulse signal PS(0). Simultaneously, each timing block 22 after the first one, upon receiving on the gate terminal of its own control NMOS transistor 62 the pulse signal PS(i) having a high logic level generated by the preceding timing block, sends the respective signal PS(i) from a low logic level to a high logic level, in turn driving switching-on of the NMOS transistor 62 present in the subsequent timing block 22.

In other words, switching of each pulse signal PS(i) to a high logic level brings about instantaneous switching of the pulse signal PS(i+1) generated by the subsequent timing block.

The enabling signal SET instantly goes to a low logic level and drives switching-off of the NMOS transistor 62. The NMOS transistor 50 of the pulse generator stage 46 then starts to drain freely a current equal to $I_{MIR}*K$, thus progressively charging the capacitors 48 present on the duration regulation branch 44. The control voltage $V_L$ on the intermediate node 58, thanks to the constant charging of the capacitors 48, progressively increases until it reaches, in the instant $T_{ON}(0)$, a threshold value such as to cause switching of the output of the NOR logic gate 66. Then the pulse signal PS(0) switches to a low logic level and drives termination of the first operation and start of the second operation that make up reading. In fact, at the instant in which the pulse signal PS(0) switches to the low logic level, the NMOS transistor 62 of the second timing block 22 switches off, and draining of the current $I_{MIR}*K$ on the capacitors 48 of the duration regulation branch 44 starts, i.e., timing (second duration) of the second operation $T_F(1)$ starts, the second operation terminating when, in a way similar to what has been said for the first timing block, the control voltage $V_L$ on the intermediate node 58 reaches the triggering threshold of the NOR logic gate 66, which switches the respective pulse signal PS(1) to a low logic level, thus driving termination of the second operation that makes up reading and start of the third operation. It is evident that the timing operations carried out by the subsequent timing blocks 22 are identical to the ones described above.

It should be pointed out that, when the control voltage $V_L$ reaches a preset value, the inverter 66 drives switching-on of the two pull-up PMOS transistors 68, 70, which rapidly send the control voltage $V_L$ on the intermediate node 58 to the triggering threshold of the NOR logic gate, thus speeding-up switching of the pulse signals PS(i) from the high logic level to the low logic level.

Figure 5:
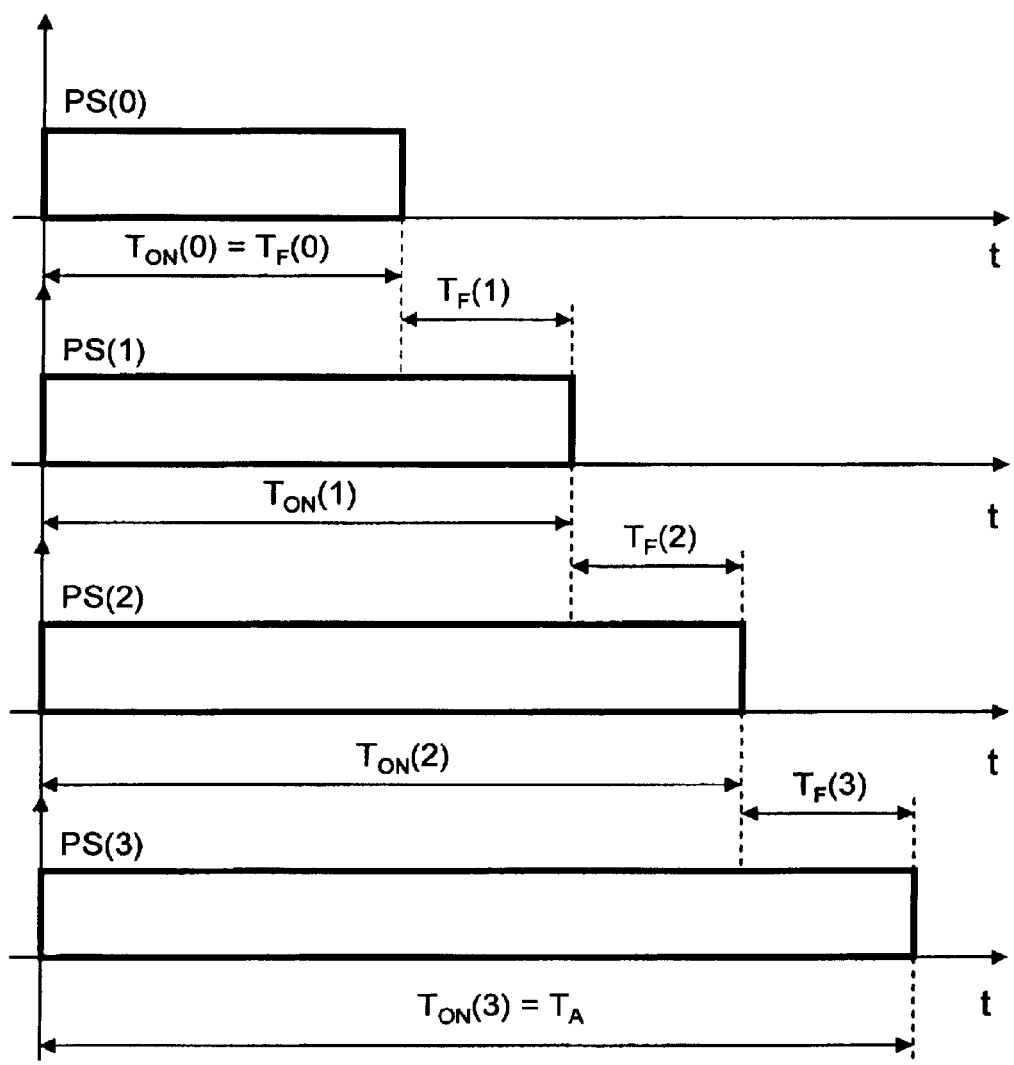
FIG. 5 are the plots in time of some pulse signals generated by the timing device shown in FIG. 3.

FIG. 5 is a schematic illustration of an example of the plots in time of the four pulse signals PS(0), PS(1), PS(2), and PS(3) generated by four respective timing blocks 22 for timing four consecutive operations that make up reading, in which the falling edge of each pulse PS(i) determines termination of the respective operation and start of the subsequent operation. In the case in point, the duration of the first operation is equal to $T_F(0)=T_{ON}(0)$, whereas the duration of the subsequent operations is equal to:

$$T_F(i)=T_{ON}(i)-T_{ON}(i-1) \quad 1 \leq i \leq 3$$

From the above description, it is evident that the duration $T_{ON}(N)$ of the pulse generated by the last timing block 22, i.e., by the N-th block, will be equal to the access time $T_A$ of the memory device.

For a more detailed treatment of the circuit structure and operation of the timing device 20 and, in particular, of the voltage generating block 21 and of the timing blocks 22, the reader is referred to the U.S. Pat. No. 6,353,350 filed on Nov. 11, 2000 in the name of the present applicant which is incorporated herein by reference.

The device described herein for timing reading of a memory device is extremely advantageous in so far as assignment of a fixed duration to each operation, irrespective of the operating condition of the memory device, guarantees completion of each operation that makes up reading, whatever the operating condition of the memory device, thus bringing about a considerable improvement in the noise rejection ratio of the memory device.

Finally, it is clear that modifications and variations can be made to the device for timing reading described and illustrated herein, without thereby departing from the scope of the present invention, as defined in the annexed claims.

What is claimed is:

1. A method for timing random reading of a memory device with a data access time, said reading being made up of a succession of consecutive operations, wherein each of said operations has, whatever the operating condition of said memory device, a fixed predetermined duration such as to guarantee completion of the operation within said fixed predetermined the worst operating condition of said memory device, the sum of the fixed predetermined durations of said operations being equal to said data access time of said memory device.

2. The timing method according to claim 1, wherein each of said operations making up said reading is started immediately at an end of the preceding operation.

3. The timing method according to claim 1, wherein said fixed predetermined duration is assigned to the corresponding operation in a design stage of said memory device.

4. The timing method according to claim 1, wherein each of said operations has a fixed predetermined duration, which is irrespective of the temperature variations of said memory device.

5. The timing method according to claim 1, wherein each of said operations has a fixed predetermined time duration, which is irrespective of the variations in a supply voltage of said memory device.

6. A device for timing random reading of a memory device with a data access time, said reading being made up of a succession of consecutive operations, said timing device comprising signal generating means, designed to generate, for each said operation, a corresponding timing signal such as to cause, whatever the operating condition of said memory device, the corresponding operation to last for a fixed predetermined duration such as to guarantee completion of said operation in the worst operating condition of said memory device, the sum of the durations of said operations being equal to said data access time of said memory device.

7. The timing device according to claim 6, wherein said signal generating means comprise a plurality of timing blocks, each of which generates a timing signal designed to drive termination of the respective operation, and is supplied at input to a timing block associated to a subsequent operation, for driving start of the latter.

8. The timing device according to claim 7, wherein each timing block comprises at least one input receiving a current which is constant and is irrespective of variations in temperature and supply voltage of said memory device, and at least one output supplying said timing signal.

9. The timing device according to claim 8, wherein said signal generating means further comprise at least one voltage generating block having an output connected to said input of said timing blocks for supplying the timing blocks with said constant current.

10. The timing device according to claim 9, wherein said voltage generating block comprises at least one NMOS cascode transistor and a resistor manufactured using an n-well technology.

11. The timing device according to claim 10, wherein said voltage generating block comprises a supply line set at the supply voltage; a ground line set at the ground voltage; at least one PMOS transistor connected to said output and to said supply line, said resistor being connected to said ground line, and said NMOS transistor being arranged between said PMOS transistor and said resistor.

12. The timing device according to claim 10, wherein said NMOS transistor has a gate terminal set at a constant gate voltage, a source terminal connected to said resistor, and a drain terminal connected to the drain terminal of said PMOS transistor.

13. The timing device according to claim 6, wherein each timing block comprises a supply line set at the supply voltage; a ground line set at the ground voltage; a signal generator stage, which is designed to generate said timing signal having a fixed duration correlated to the fixed predetermined time of a respective operation; and a time duration regulation stage, which is designed to regulate said duration of said timing signal and is connected in series to said signal generator stage between said supply line and said ground line.

14. The timing device according to claim 13, wherein said signal generator stage and said duration regulating branch are connected to said constant current input so as to define with the voltage generating block a current mirror.

15. The timing device according to claim 14, wherein said signal generator stage comprises at least one NMOS cascode transistor.

16. The timing device according to claim 13, wherein said duration regulating branch comprises a plurality of capacitors connected in parallel to one another, and a plurality of selector means, designed to connect selectively each said capacitor to said duration regulating branch.

17. The timing device according to claim 16, wherein said signal generator stage comprises at least one PMOS transistor connected to said supply line, at least one NMOS transistor connected to said NMOS transistor at an intermediate node, and at least one logic gate arranged between said intermediate node and said output.

* * * * *